US009048215B2

(12) United States Patent
Asahara

(10) Patent No.: US 9,048,215 B2
(45) Date of Patent: Jun. 2, 2015

(54) SEMICONDUCTOR DEVICE HAVING A HIGH BREAKDOWN VOLTAGE

(71) Applicant: KABUSHIKI KAISHA TOSHIBA, Tokyo (JP)

(72) Inventor: Hidetoshi Asahara, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/014,260

(22) Filed: Aug. 29, 2013

(65) Prior Publication Data

US 2014/0320193 A1 Oct. 30, 2014

(30) Foreign Application Priority Data

Apr. 26, 2013 (JP) ................................ 2013-094677

(51) Int. Cl.
*H01L 29/78* (2006.01)
*H01L 29/40* (2006.01)
*H03K 17/041* (2006.01)

(52) U.S. Cl.
CPC .......... *H01L 29/407* (2013.01); *H01L 29/7813* (2013.01); *H03K 17/04106* (2013.01)

(58) Field of Classification Search
CPC ..... H01L 29/739; H01L 29/78; H01L 29/778; H01L 29/7813
USPC .................................................. 257/330, 333
See application file for complete search history.

(56) References Cited

U.S. PATENT DOCUMENTS 7,375,029 B2 5/2008 Poelzl
8,299,524 B2 * 10/2012 Takaishi ........................ 257/333
8,482,061 B2 * 7/2013 Nishimura .................... 257/330
8,592,895 B2 * 11/2013 Yilmaz et al. ................. 257/330
8,598,652 B2 * 12/2013 Takaya .......................... 257/331
8,742,401 B2 * 6/2014 Yilmaz et al. .................. 257/30
2005/0224870 A1 * 10/2005 Kinzer .......................... 257/330
2007/0138544 A1 * 6/2007 Hirler et al. .................. 257/330
2009/0090966 A1 4/2009 Thorup et al.
2009/0140329 A1 * 6/2009 Yoshimochi ................. 257/330
2010/0301408 A1 * 12/2010 Werner ......................... 257/330
2012/0049273 A1 * 3/2012 Hirler et al. .................. 257/330
2012/0056262 A1 3/2012 Saito et al.
2012/0261714 A1 * 10/2012 Taketani et al. ............... 257/139
2013/0009240 A1 * 1/2013 Takaishi ........................ 257/330
2013/0069150 A1 * 3/2013 Matsuoka et al. ............ 257/330

FOREIGN PATENT DOCUMENTS

JP 2006-108514 4/2006
JP 2008-227514 9/2008
JP 2012-059841 A 3/2012

* cited by examiner

*Primary Examiner* — Nathan Ha
(74) *Attorney, Agent, or Firm* — Patterson & Sheridan LLP

(57) ABSTRACT

A semiconductor device includes a first layer of a first-type, a second layer of a second-type formed on the first layer, a third layer of the first type formed on the second layer, a first electrode connected to the second and third layers, a second electrode connected to the first layer, a third electrode embedded in a trench formed through the third and second layers and into the first layer, a fourth electrode embedded in the trench below the third electrode, and an insulating layer formed in the trench around the fourth electrode. The first layer includes a first region that is in contact with the insulating layer and at which a concentration of the first-type dopant is lower than the concentration at a second region that is formed around the first region.

20 Claims, 3 Drawing Sheets

SEMICONDUCTOR DEVICE HAVING A HIGH BREAKDOWN VOLTAGE

CROSS-REFERENCE TO RELATED APPLICATION

This application is based upon and claims the benefit of priority from Japanese Patent Application No. 2013-094677, filed Apr. 26, 2013, the entire contents of which are incorporated herein by reference.

FIELD

Embodiments described herein relate generally to a semiconductor device.

BACKGROUND

Stable operation is desirable for a semiconductor device that has a structure of a Metal Oxide Semiconductor Field Effect Transistor (MOSFET) and has a vertical electrode structure to have a high breakdown voltage. In the related art, a high breakdown voltage is obtained by widening the distribution of an electric field in a semiconductor device during operation, thereby preventing the electric field from being too concentrated.

DETAILED DESCRIPTION

Figure 1:
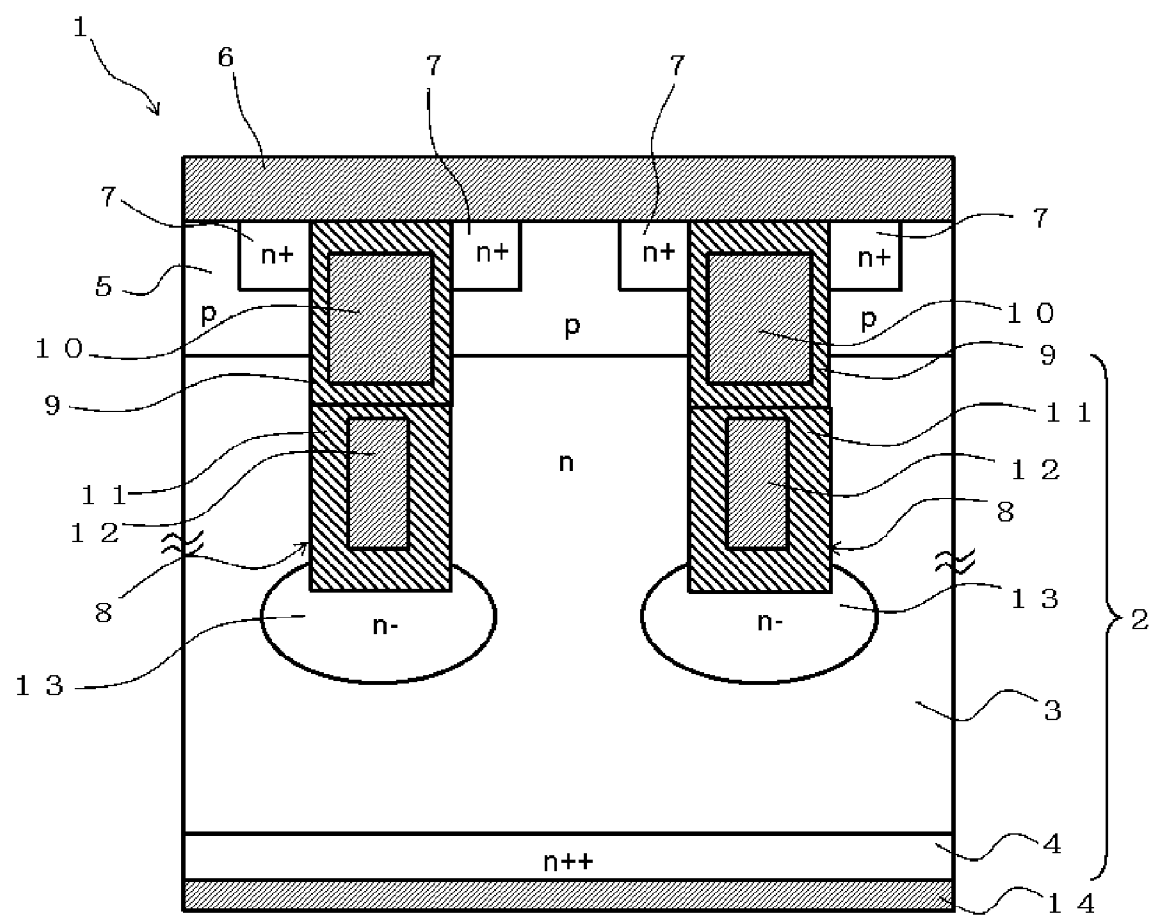
FIG. 1 is a cross-sectional view of a semiconductor device according to a first embodiment.

According to an embodiment, a semiconductor device with a higher breakdown voltage can be provided.

In general, according to one embodiment, a semiconductor device includes a first semiconductor layer of a first conductivity type, a second semiconductor layer of a second conductivity type formed on the first semiconductor layer, a third semiconductor layer of the first conductivity type formed on the second semiconductor layer, a first electrode electrically connected to the second semiconductor layer and the third semiconductor layer, a second electrode electrically connected to the first semiconductor layer, a third electrode embedded in a trench formed through the third semiconductor layer and the second semiconductor layer and into the first semiconductor layer, a fourth electrode embedded in the trench below the third electrode, and an insulating layer formed in the trench around the fourth electrode, The first semiconductor layer includes a first region that is in contact with the insulating layer and at which a concentration of a first conductivity type dopant is lower than the concentration of the first conductivity type dopant at a second region of the first semiconductor layer that is formed around the first region.

Hereinafter, embodiments of the present disclosure will be described with reference to the drawings. The drawings used for explaining the embodiments are schematic drawings for facilitating the explanation. In actually implementing individual components in the drawings, the shapes, dimensions, and magnitude relations of those components are not necessarily limited to those shown in the drawings, and can be appropriately changed as far as the effects of the embodiment can be obtained. The explanation will be made based on an assumption that a first conductivity type is n type and a second conductivity type is p type; however, it is also possible to set the first conductivity type and the second conductivity type as p type and n type, respectively. As a semiconductor, silicon (Si) will be described as an example; however, the present disclosure can also be applied to compound semiconductors such as silicon carbide (SiC) and gallium nitride (GaN). In a case where conductivity types of n type are denoted by $n^{++}$, $n^{+}$, n, and $n^{-}$, a concentration of the n-type dopant decrease in order of $n^{++}$, $n^{+}$, n, and $n^{-}$. In the case where the first conductivity type is p type, a concentration of p-type dopant decrease in order of $p^{++}$, $p^{+}$, p, and $p^{-}$.

(First Embodiment)

FIG. 1 is a cross-sectional view illustrating a semiconductor device 1 according to a first embodiment. The semiconductor device 1 includes an n-type semiconductor substrate 2. The n-type semiconductor substrate 2 is composed of an n-type drift layer 3 and an $n^{++}$-type drain layer 4. Further, the $n^{++}$-type drain layer 4, a surface of which forms one surface of the n-type semiconductor substrate 2, is electrically connected to a drain electrode 14 (a second electrode).

On a surface of the n-type drift layer 3, which is opposite to a surface of the n-type drift layer 3 on which the $n^{++}$-type drain layer 4 is formed, a p-type base layer 5 (a second semiconductor layer) is formed. On a surface of the p-type base layer 5, a plurality of $n^{+}$-type source layers 7 (third semiconductor layers) are selectively formed. The p-type base layer 5 and the $n^{+}$-type source layer 7 are connected to a source electrode 6 (a first electrode) formed thereon.

A plurality of gate trenches 8 is formed from a surface of the $n^{+}$-type source layer 7, and the bottom of the gate trench reaches the inside of the n-type drift layer 3.

In an upper portion of each of the gate trenches 8, a gate electrode 10 is formed with a gate insulating film 9 being formed therearound (an insulating film). Here, the upper portion of the gate trench 8 denotes a portion which is adjacent to the p-type base layer 5 and the $n^{+}$-type source layer 7 corresponding to the gate trench 8; however, as shown in FIG. 1, a part of the upper portion may be adjacent to a portion of the n-type drift layer 3. The gate electrode 10 is formed to be adjacent to at least the p-type base layer 5.

At a lower portion of each of the gate trenches 8 (a portion of the gate trench 8 closer to the drain electrode 14 with respect to the gate electrode 10), an embedded electrode 12 is provided with a field insulating film 11 (an insulating layer) being formed therearound. Each of the embedded electrodes 12 is adjacent to the n-type drift layer 3 with the field insulating film 11 being formed therebetween. As described above, the semiconductor device 1 has a field plate structure in which each of the embedded electrodes 12 formed inside each gate trench 8 is insulated from the n-type drift layer 3 and a corresponding gate electrode 10 by a corresponding field insulating film 11.

Also, each embedded electrode 12 is electrically connected to the source electrode 6 and has a same potential as that of the source electrode 6. Further, even when each embedded electrode 12 is electrically connected to a corresponding gate electrode 10, in terms of a breakdown voltage, the same effect can be achieved. Furthermore, a thickness of each field insulating film 11 is set to be greater than a thickness of each gate insulating film 9.

Also, in the n-type drift layer 3 at the bottom of the gate trench 8, an $n^{-}$-type diffusion region 13 is formed. Due to the $n^-$-type diffusion layer 13, an electric field distribution is spread into the n-type semiconductor substrate 2 during operation of the semiconductor device 1, thereby relieving electric field concentration. Therefore, it is possible to raise the breakdown voltage.

As the gate insulating film 9 and the field insulating film 11, for example, silicon oxide ($SiO_2$) is used; however, other insulators such as silicon nitride (SiN), silicon oxynitride (SiON), and alumina ($Al_2O_3$) may be used.

The semiconductor device 1 has the above-mentioned structure.

Also, in the present embodiment, the semiconductor device has a MOSFET structure but is not limited thereto. The semiconductor device may have other structures such as an Insulated Gate Bipolar Transistor (IGBT) structure and a diode structure. For example, in the case of the IGBT structure, a p-type collector layer is provided between the $n^{++}$-type drain layer 4 and the drain electrode 14.

Operation of the semiconductor device 1 will be described. For example, in a state in which a positive potential relative to the source electrode 6 is applied to the drain electrode 14, a positive voltage larger than a threshold voltage is applied to the gate electrode 10. In this case, an inversion region is formed at a portion of the p-type base layer 5 adjacent to each of the gate electrodes 10 surrounded by the corresponding gate insulating film 9. Therefore, the semiconductor device 1 becomes an ON state, whereby electrons flow.

The electrons flow from the source electrode 6 to the drain electrode 14 through the $n^+$-type source layer 7, the n-type inversion region (that is, a channel of the semiconductor device 1) formed in the p-type base layer 5, the n-type drift layer 3, and the $n^{++}$-type drain layer 4. In other words, in the ON state, an electric current flows from the drain electrode 14 to the source electrode 6.

Meanwhile, if the voltage applied to the gate electrodes 10 is 0 V or a voltage lower than the threshold voltage, the inversion region, which is an electron channel, disappears, whereby the flow of the electrons from the source electrode 6 is interrupted. As a result, the semiconductor device 1 becomes an OFF state (a reverse-bias application state).

When the semiconductor device 1 is in the OFF state, a voltage being applied between the source electrode 6 and the drain electrode 14 causes a depletion region to spread from an interface between the n-type drift layer 3 and the p-type base layer 5 toward the n-type drift layer 3 and the p-type base layer 5. Also, since each of the embedded electrodes 12 also has a same potential as that of the source electrode 6, in a region of the n-type drift layer 3 adjacent to the field insulating film 11, the depletion region spreads inward the n-type drift layer 3.

As described above, in the semiconductor device 1, the voltage of the gate electrode 10 is controlled, and thereby switching between the ON state and the OFF state is performed.

Effects achieved by the semiconductor device 1 according to the present embodiment will be described.

In the semiconductor device 1 of the present embodiment, each of the $n^-$-type diffusion regions 13 is formed in the n-type drift layer 3 adjacent to the bottom of the gate trench 8. Due to the $n^-$-type diffusion regions 13, it is possible to widen the electric field distribution in the n-type drift layer 3 adjacent to the bottom of the gate trenches 8, and it is possible to suppress electric field concentration. In other words, it is possible to raise the breakdown voltage. Also, in the semiconductor device 1 of the present embodiment, even if any change is not made with respect to four factors (to be mentioned below), it is possible to raise the breakdown voltage by changing a concentration of the n-type dopant in the $n^-$-type diffusion layers 13.

The breakdown voltage between the drain electrode 14 and the source electrode 6 depends on the electric field distribution of the semiconductor device 1 during operation. At this time, (1) a thickness of the field insulating film 11, (2) a length of the embedded electrode 12, (3) drift resistance (a dopant concentration), and (4) an interval between adjacent gate trenches 8 are factors to determine the electric field distribution. For this reason, it is necessary to determine optimal conditions with respect to those four factors to control the electric field distribution such that the breakdown voltage is raised. Besides, it is assumed that the n-type semiconductor substrate 2 is so thick that the breakdown voltage is not determined by the thickness of the n-type semiconductor substrate 2.

Figure 2:
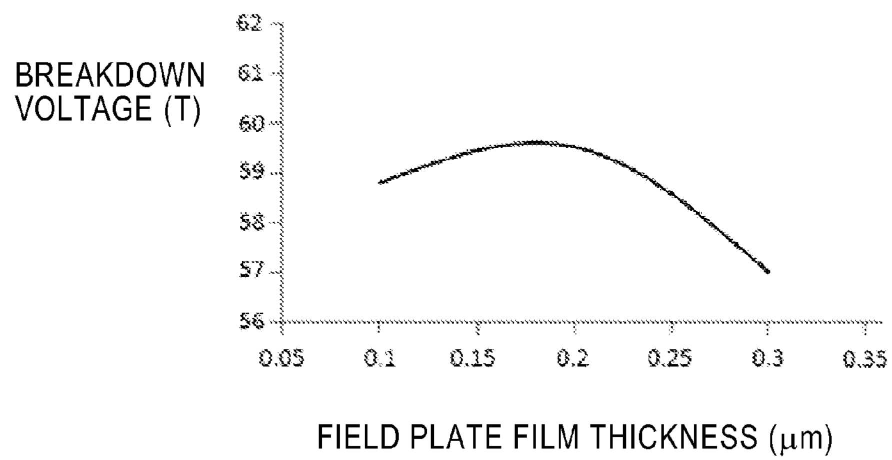
FIG. 2 illustrates a relation between a thickness of an embedded electrode and a breakdown voltage in the semiconductor device according to the first embodiment.

FIG. 2 illustrates a relation between the thickness (width in a direction along a plane of the substrate) of the embedded electrode 12 and the breakdown voltage. As shown in FIG. 2, the breakdown voltage shows an upwardly convex relation with respect to the thickness of the embedded electrode 12, and an optimal condition of the thickness of the embedded electrode 12 exists. However, since expected breakdown voltages vary among semiconductor devices to be manufactured, the above-mentioned factors including the thickness of the embedded electrode 12 are determined based on the expected breakdown voltages. Therefore, it is difficult to obtain optimal conditions with respect to each of the breakdown voltages of semiconductor devices. However, in the semiconductor device 1 of the present embodiment, since it is possible to control the electric field distribution by changing the concentration of the n-type dopant in the $n^-$-type diffusion layers 13, it is unnecessary to obtain optimal conditions with respect to the factors (1) to (4).

According to the semiconductor device 1 of the present embodiment, for example, in a case of using a semiconductor device 1 in which the drift resistance of an n-type semiconductor substrate 2 is 0.4Ω cm, and a breakdown voltage of 55 V is obtained, by forming the $n^-$-type diffusion region 13 of which drift resistance is 0.5Ω cm in the n-type drift layer 3 adjacent to the bottom of the gate trenches 8, the breakdown voltage between the drain electrode 14 and the source electrode 6 can be increased up to 60 V.

Also, in the semiconductor device 1, between the individual electrodes, for example, between the source electrode 6 and the drain electrode 14, a capacitor for accumulating electric charge is created. Since the embedded electrodes 12 of the semiconductor device 1 according to the present embodiment are connected to the source electrode 6, the capacitance between the source electrode 6 and the drain electrode 14 is reduced. Therefore, high-speed switching may be achieved.

(First Modification)

Figure 3:
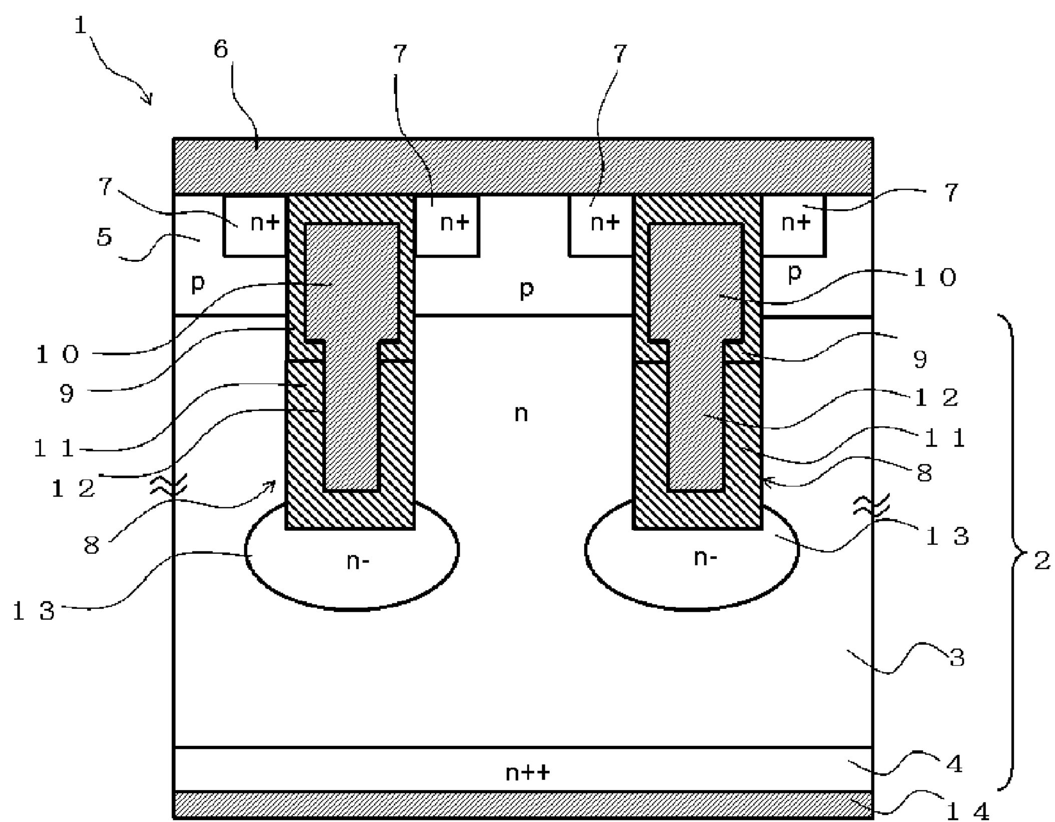
FIG. 3 is a cross-sectional view of a semiconductor device according to a first modification of the first embodiment.

FIG. 3 is a view illustrating a first modification of the semiconductor device 1 according to the first embodiment. In the present modification, each of the embedded electrodes 12 is in contact with a corresponding gate electrode 10 provided thereon. Even in present modification, the design according to the $n^-$-type diffusion layers 13 is applicable. Also in the present modification, it is possible to achieve the same effects as those of the first embodiment.

(Second Embodiment)

Figure 4:
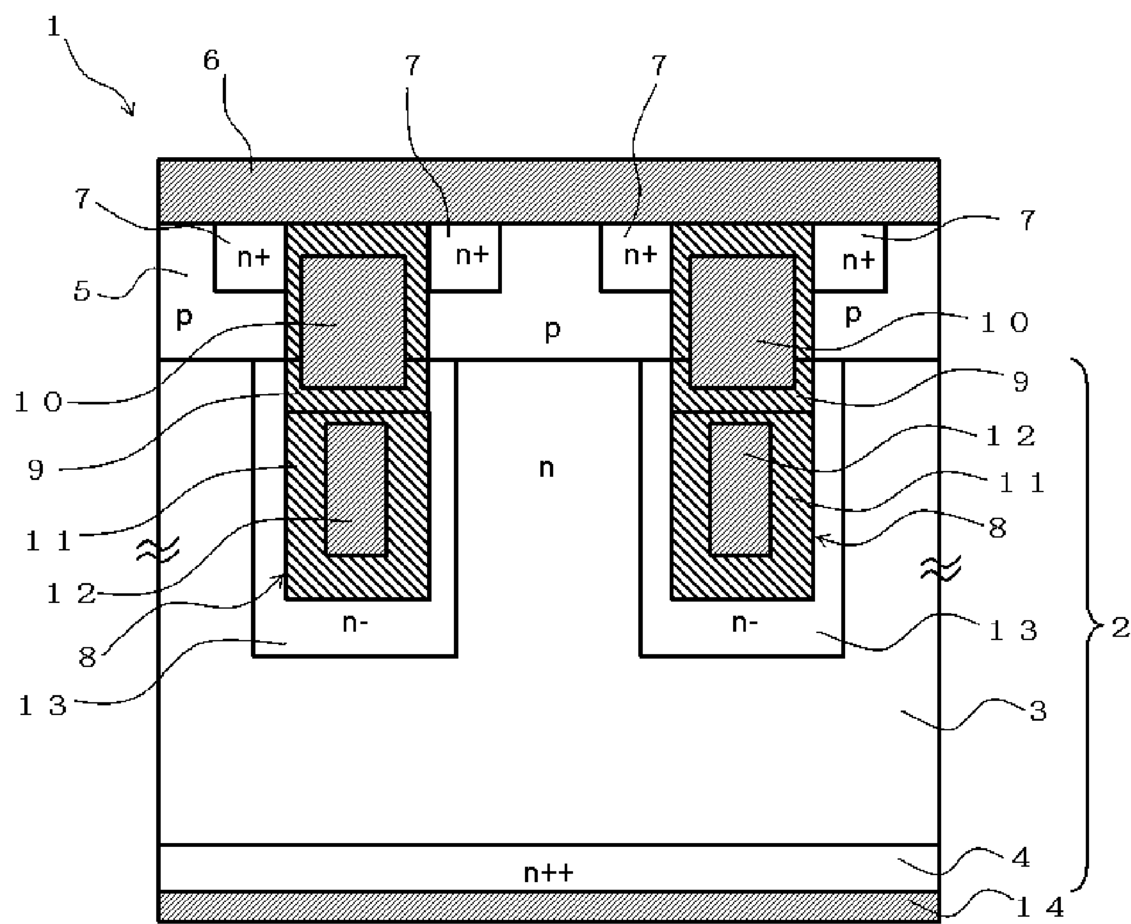
FIG. 4 is a cross-sectional view of a semiconductor device according to a second embodiment.

FIG. 4 is a cross-sectional view illustrating a semiconductor device 1 according to a second embodiment. In the semiconductor device 1 of the second embodiment, the $n^-$-type diffusion region 13 is formed to be adjacent not only to the bottoms of the gate trenches 8 but also to p-type base layer 5. That is, each of the $n^-$-type diffusion regions 13 is in contact with the p-type base layer 5. Therefore, it is possible to control the electric field distribution not only in the vicinities of the bottoms of the gate trenches 8 but also in the other regions of the n-type drift layer 3. In other words, it is possible to further raise the breakdown voltage.

Also, in the present embodiment, it is possible to reduce not only a capacitance between the source electrode 6 and the drain electrode 14 but also, for example, a capacitance between the gate electrode 10 and the source electrode 6, and between the drain electrodes 14 and the source electrode 6. Therefore, it is possible to further improve the high-speed switching effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a first semiconductor layer of a first conductivity type;

a second semiconductor layer of a second conductivity type provided on the first semiconductor layer;

a third semiconductor layer of the first conductivity type provided on the second semiconductor layer;

a first electrode electrically connected to the second semiconductor layer and the third semiconductor layer;

a second electrode electrically connected to the first semiconductor layer;

a third electrode embedded in a trench provided through the third semiconductor layer and the second semiconductor layer and into the first semiconductor layer;

a fourth electrode embedded in the trench below the third electrode; and an insulating layer provided in the trench around the fourth electrode, wherein the first semiconductor layer includes a first region that is in contact with the insulating layer and at which a concentration of a first conductivity type dopant is lower than the concentration of the first conductivity type dopant at a second region of the first semiconductor layer that is provided around the first region and wherein a concentration of a second conductivity type dopant is uniform across the second semiconductor layer.

2. The semiconductor device according to claim 1, wherein the first region of the first semiconductor layer is in contact with the insulating layer at a bottom of the trench.

3. The semiconductor device according to claim 2, wherein the first region of the first semiconductor layer covers the insulating layer at a bottom edge of the trench.

4. The semiconductor device according to claim 1, wherein the insulating layer is surrounded by the first region of the first semiconductor layer.

5. The semiconductor device according to claim 1, wherein the fourth electrode is electrically connected to the first electrode and insulated from the third electrode.

6. The semiconductor device according to claim 1, wherein the fourth electrode is electrically connected to the third electrode.

7. The semiconductor device according to claim 1, wherein the first semiconductor layer includes a third region between the second region and the second electrode, a concentration of the first conductivity type dopant at the third region is higher than the concentration of the first conductivity type dopant at the second region.

8. A semiconductor device comprising:

a first semiconductor layer of a first conductivity type;

a second semiconductor layer of a second conductivity type provided on the first semiconductor layer;

a plurality of third semiconductor layers of the first conductivity type provided on the second semiconductor layer;

a first electrode electrically connected to the second semiconductor layer and the third semiconductor layers;

a second electrode electrically connected to the first semiconductor layer;

a plurality of third electrodes, each of which is embedded in a trench provided through one of the third semiconductor layers and the second semiconductor layer and into the first semiconductor layer;

a plurality of fourth electrodes, each of which is embedded in the trench below the third electrode; and a plurality of insulating layers, each of which is provided around one of the fourth electrodes, wherein the first semiconductor layer includes a plurality of first regions, each of which is in contact with one of the insulating layers, and a concentration of a first conductivity type dopant at the first regions is lower than the concentration of the first conductivity type dopant at a second region of the first semiconductor layer that is provided around the first regions and wherein a concentration of a second conductivity type dopant is uniform across the second semiconductor layer.

9. The semiconductor device according to claim 8, wherein each of the first regions of the first semiconductor layer is in contact with each of the insulating layers at a bottom of one of the trenches.

10. The semiconductor device according to claim 9, wherein each of the first regions of the first semiconductor layer covers one of the insulating layers a bottom edge of one of the trenches.

11. The semiconductor device according to claim 8, wherein each of the insulating layers is surrounded by one of the first regions of the first semiconductor layer.

12. The semiconductor device according to claim 8, wherein each of the fourth electrodes is electrically connected to the first electrode and insulated from each of the third electrodes.

13. The semiconductor device according to claim 8, wherein each of the fourth electrodes is electrically connected to one of the third electrodes.

14. The semiconductor device according to claim 8, wherein the first semiconductor layer includes a third region between the second region and the second electrode, a concentration of the first conductivity type dopant at the third region is higher than the concentration of the first conductivity type dopant at the second region.

15. The semiconductor device according to claim 1, wherein the first region of the first semiconductor layer is in contact with the insulating layer at a bottom of the trench.

16. The semiconductor device according to claim 2, wherein the first region of the first semiconductor layer covers the insulating layer at a bottom edge of the trench.

17. The semiconductor device according to claim 1, wherein the insulating layer is surrounded by the first region of the first semiconductor layer.

18. The semiconductor device according to claim 1, wherein the fourth electrode is electrically connected to the first electrode and insulated from the third electrode.

19. The semiconductor device according to claim 1, wherein the first semiconductor layer includes a third region between the second region and the second electrode, a concentration of the first conductivity type dopant at the third region is higher than the concentration of the first conductivity type dopant at the second region.

20. A semiconductor device comprising:

a first semiconductor layer of a first conductivity type;

a second semiconductor layer of a second conductivity type provided on the first semiconductor layer;

a third semiconductor layer of the first conductivity type provided on the second semiconductor layer;

a first electrode electrically connected to the second semiconductor layer and the third semiconductor layer;

a second electrode electrically connected to the first semiconductor layer;

a third electrode embedded in a trench provided through the third semiconductor layer and the second semiconductor layer and into the first semiconductor layer;

a fourth electrode embedded in the trench below the third electrode; and an insulating layer provided in the trench around the fourth electrode, wherein the first semiconductor layer includes a first region that is in contact with the insulating layer and at which a concentration of a first conductivity type dopant is lower than the concentration of the first conductivity type dopant at a second region of the first semiconductor layer that is provided around the first region, wherein the first electrode is in contact with the insulating layer at a top of the trench, and wherein an upper surface of the third electrode is below an upper surface of the third semiconductor layer.

* * * * *